United States Patent [19]

Iwai et al.

[11] 4,065,625
[45] Dec. 27, 1977

[54] LEAD FRAME FOR A SEMICONDUCTOR DEVICE

[75] Inventors: Naoji Iwai, Tokyo; Takashi Uchida, Yokohama; Takemi Abe, Kawasaki, all of Japan

[73] Assignee: Tokyo Shibaura Electric Co., Ltd., Kawasaki, Japan

[21] Appl. No.: 627,258

[22] Filed: Oct. 30, 1975

[30] Foreign Application Priority Data

Oct. 31, 1974 Japan ................. 49-124932

[51] Int. Cl.$^2$ ............... B23P 3/20; H01L 23/48
[52] U.S. Cl. ............... 428/596; 174/52 FP; 357/70; 428/336; 428/620; 428/653
[58] Field of Search ............... 174/52 FP, 52; 29/196.2, 193.5; 357/70; 428/596, 336, 620, 653

[56] References Cited

U.S. PATENT DOCUMENTS

| 2,818,360 | 12/1957 | Porter | 29/196.2 X |
| 3,469,953 | 9/1969 | St. Clair et al. | 29/193.5 |
| 3,705,023 | 12/1972 | Fister | 29/196.2 |
| 3,714,370 | 1/1973 | Nixen et al. | 174/52 FP |

*Primary Examiner*—J. V. Truhe
*Assistant Examiner*—D. A. Tone
*Attorney, Agent, or Firm*—Oblon, Fisher, Spivak, McClelland & Maier

[57] ABSTRACT

A lead frame for a semiconductor device, wherein a semiconductor chip-mounting portion, inner lead portions to be connected to the electrodes of said chip and outer lead portions connected to the inner lead portions are each formed of an iron core strip, both sides of which are clad with a layer of aluminum or alloy thereof.

3 Claims, 10 Drawing Figures

LEAD FRAME FOR A SEMICONDUCTOR DEVICE

This invention relates to a lead frame used in assembling a semiconductor device, and more particularly to the material of a lead frame applied in leading out the electrodes of a sealed type semiconductor device.

A lead frame is used where a semiconductor chip including an integrated circuit is sealed in a plastic material, and the required terminals of the integrated circuit are led out of the sealing plastic material to provide a semiconductor device. This lead frame is formed of a metal strip pinched in several places to provide the portion on which the semiconductor chip is mounted, inner portions to be connected to the terminals of said chip and outer lead portions connected to the inner lead portions. All these portions are supported by connection portions to have prescribed relative positions. The semiconductor chip is set on the mounting portion of the lead frame, and the electrodes of said chip are connected to the inner lead portions by a wire of gold or alloy thereof. Thereafter, the chip, connection metal wires and inner lead portions are sealed in the moldable plastic material. The unnecessary portions of the lead frame are removed with the outer lead portions left out for connecting the sealed semiconductor device at the outer lead portions to an external electrical device.

To date, the material of the lead frame has been prepared from any of the groups consisting of KOVAR (alloy of iron, nickel and cobalt), nickel, iron-nickel alloy and other nickel alloys. The reason is that where a semiconductor device is assembled and applied to practical use, the material of the lead frame is demanded to be corrosion-resistant. The electrodes of the chip are made of aluminum. Further, gold or alloy thereof is used as a wire for connecting the electrodes of the chip to the inner lead portions of the lead frame. The reason is that a material applied for this purpose is demanded to attain easy thermal pressure bonding between the aluminum electrodes of the semiconductor chip and the one side ends of said connection wires and also to have high corrosion resistance and large elongation when the assembled mass is sealed in the plastic material. It is possible to plate the inner lead portions with gold or silver for easy thermal pressure bonding with the other side ends of the connection wires of gold or alloy thereof. However, not only are gold and silver expensive, but also the plating of the inner lead portions with gold or silver consumes a great deal of time, eventually raising the cost of manufacturing a semiconductor device.

It is accordingly an object of this invention to provide such a lead frame for use with a semiconductor device as includes inner lead portions capable of thermal pressure bonding with the connection wires of gold or alloy thereof without applying the above-mentioned plating on said inner lead portions.

Another object of the invention is to provide a lead frame capable of cutting down the cost of manufacturing a semiconductor device.

With the lead frame of this invention, the semiconductor chip-mounting portion, inner lead portions to be connected to the electrodes of the semiconductor chip and outer lead portions connected to the inner lead portions are each formed of an iron core strip, both sides of which are clad with a layer of aluminum or alloy thereof.

According to this invention, the lead frame has its surface clad with a layer of aluminum or alloy thereof, attaining easy thermal pressure bonding between the connection wires of gold or alloy thereof and inner lead portions. Elimination of the necessity of plating the inner lead portions of the lead frame with gold or silver as has been practised in the prior art decreases the cost of manufacturing a semiconductor device.

This invention can be more fully understood from the following detailed description when taken in conjunction with the accompanying drawings, in which.

Figure 1:
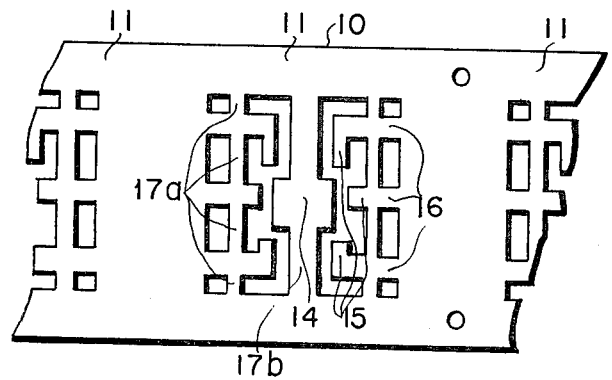
FIG. 1 is a plan view of a lead frame according to this invention.
Figure 7:
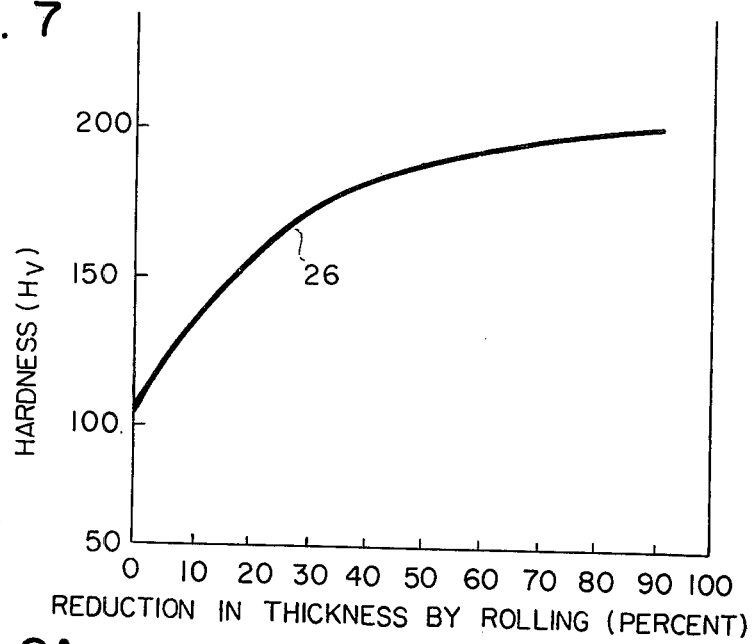
Figure 8A:
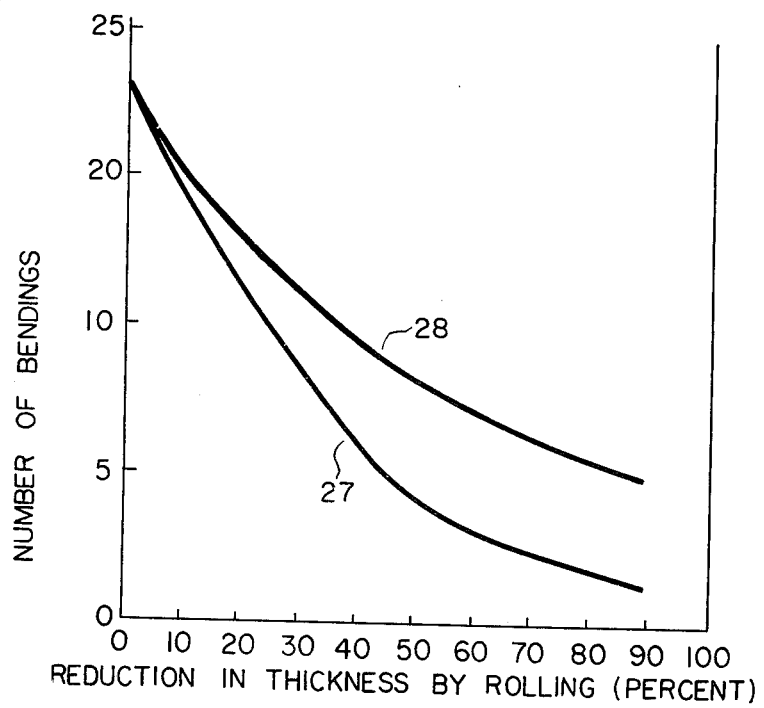
Figure 8B:
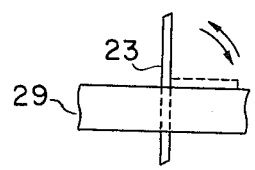

FIG. 7 indicates the relationship between the reduced thickness by rolling of the clad material constituting the lead frame of FIG. 1 and the hardness of the iron core of said lead frame;

FIG. 8A sets forth the relationship between the reduced thickness by rolling of the clad material constituting the lead frame of FIG. 1 and a maximum number of times said clad material is repeatedly subjected to bending up to its breaking point; and FIG. 8B shows the process of measuring a maximum number of repeated bendings of said clad material up to its breaking point.

Figure 2:
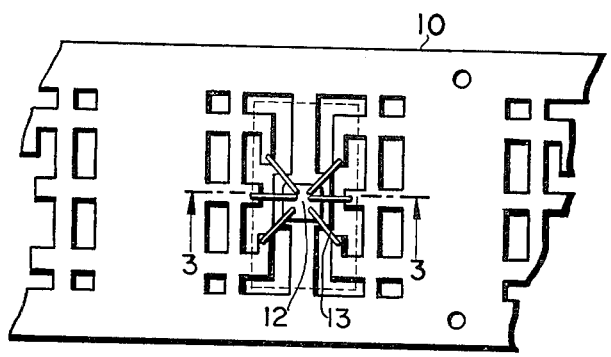
FIG. 2 is a plan view of a semiconductor chip mounted on one of the lead frames used in the practical manufacture of semiconductor devices with the electrodes of said chip connected to the inner lead portions of the lead frame by metal connection wires.

Referring to FIGS. 1 and 2, reference numeral 10 denotes an iron core strip having a thickness of, for example 0.25mm, both sides of which are clad with a layer of aluminum or alloy thereof 3 to 7 microns thick. The clad material 10 is punched in several places to provide a plurality of lead frames 11. The lead frame 11 comprises a chip-mounting portion 14 on which there is mounted, for example, a semiconductor chip 12 bearing an integrated circuit; inner lead portions 15 for connecting the one side ends of metal wires 13 (FIG. 2), the other side ends of which are connected to the electrodes of the semiconductor chip 12; outer lead portions 16 formed by the extensions of said inner lead portions 15; and supporting portions or connection portions 17a, 17b for mechanically stabilizing the semiconductor chip-mounting portion 14 and inner lead portions 15. The construction of the lead frame 11 is already known, except for the clad material 10.

Figure 3:
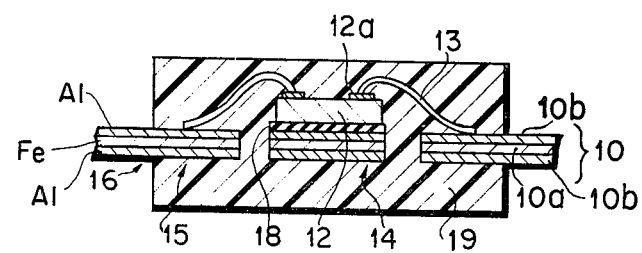
FIG. 3 is a sectional view on line 3—3 of FIG. 2 after the portions enclosed in dotted lines are sealed in a plastic material.
Figure 4:
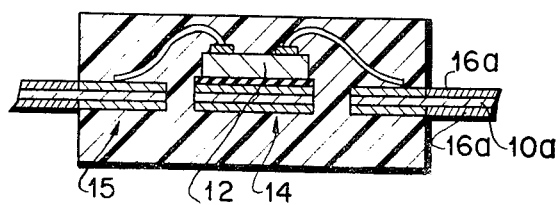
FIG. 4 is a sectional view of the outer lead portions of the sealed semiconductor device of FIG. 3 plated with tin.

While the clad material 10 is detailed later, there will now be described by reference to FIGS. 3 and 4 an example of the process of assembling a semiconductor device using the above-mentioned lead frame 11. First, the semiconductor chip 12 is bonded on the surface of the chip-mounting portion 14 of the lead frame 11 by a conductive adhesive agent 18 mainly consisting of, for example, epoxy resin. As illustrated in FIG. 3, the clad material 10 is formed of an iron core strip 10a, both sides of which are clad with a layer of aluminum or alloy thereof 10b. The one side ends of connection wires 13 of gold or alloy thereof are bonded to the terminals or electrodes 12a (consisting of aluminum layers) of the semiconductor chip 12 by means of thermal pressure bonding. The other side ends of the connection wires 13 of gold or alloy thereof are connected to the free ends of the inner lead portions 15 by the thermal pressure bonding. The semiconductor chip 12, connection wires 13 of gold or alloy thereof, chip-mounting portion 14 and inner lead portions 15 are all sealed, as shown in FIG. 3, in a plastic material 19 by the known transfer molding process or resin casting process. The regions of the lead frame 11 which are sealed in the plastic material 19 are indicated in dotted lines in FIG. 2. Upon completion of sealing, the supporting portions 17a are removed by punching and also the outer lead portions 16 and other supporting portion 17b are cut off the clad material 10, thereby providing a semiconductor device shown in FIG. 3. The outer lead portions 16 are bent in a prescribed direction. The aluminum layers 10b still remaining on both sides of said outer lead portions 16 may be removed by immersing in a hot alkali solution those parts of the outer lead portions 16 which are exposed to the outside of the plastic material in order to dissolve out the aluminum layers 10b. Thereafter, the exposed parts of the outer lead portion 16 now stripped of the aluminum layers 10b are plated with solder or tin by being immersed in the corresponding solution to facilitate the subsequent attachment of the semiconductor device to external parts. FIG. 4 shows a layer 16a of solder plated on the outer lead portions 16.

The present inventors have experimentally discovered that a clad material constituting a lead frame used in assembling a semiconductor device is preferred to comprise a layer of aluminum alloy hving the undermentioned composition and to be produced by the process described below. This process consists in cladding by cold press a layer of aluminum alloy containing 0.5 to 1.5% by weight of silicon and 0.3 to 0.6% by weight of iron on both sides of an iron core strip, annealing the clad material at temperatures ranging between a higher level than the softening point of the iron core strip and a lower level than 600° C, and finally cold rolling said clad material to 30 to 70% of its original thickness. It has also been discovered that the final thickness of the layer of aluminum alloy is desired to range between 2 and 20 microns.

There will now be described the preferred form of clad material used with the lead frame of this invention by reference to experimental data given in FIGS. 5 to 8. When a layer of aluminum or alloy thereof is clad by cold press on both sides of an iron core strip, then the iron core strip increases in hardness by said cold press. In this case, previous annealing of the clad material is required for the cold press of said iron core to a final thickness of, for example, 0.25 mm (the thickness of the cold material is considered negligibly thin) adapted for use with the lead frame of this invention. Without said previous cold rolling, the iron core strip would excessively decrease in thickness when the clad material is cold pressed thereto. The resultant lead frame would fail to provide the mechanical strength demanded for use with a semiconductor device. Obviously, the mechanical strength of the lead frame is governed by that of said iron core strip. Since iron is softened at 550° C, the above-mentioned previous annealing should be carried out at higher temperatures than at least 550° C. Where, however, previous annealing is applied on an iron core strip clad with a layer of pure aluminum at higher temperatures than 550° C, then undesirable compounds of iron and aluminum such as $FeAl_3$, $Fe_2Al_5$ or $FeAl_2$ are already formed on the boundary between both metals, before the level of 550° C is reached, that is at a lower level around 490° C. These iron-aluminum compounds are brittle and lack ductility and consequently are displaced while the iron core strip and aluminum layers clad thereon are extended by cold rolling after annealing with the resultant occurrence of a narrow space therebetween, causing the iron core strip and aluminum layers to be separated from each other.

However, application of an aluminum alloy containing 0.5 to 1.5% of silicon and 0.3 to 1.5% of iron does not allow the aforesaid undesirable compounds to be grown, unless the annealing temperature rises over 600° C. Further, where a layer of pure aluminum is clad on the iron core strip, and connection wires 13 of gold or alloy thereof are bonded to the inner lead 15 by means of thermal pressure bonding, then the capillary end portion of the bonding jig sinks into the layer of soft pure aluminum to cause the periphery of the bonded portion to be raised, possibly giving rise to the breakage of said connection wires 13. In contrast, a layer of aluminum alloy containing 0.5 to 1.5% of silicon and 0.3 to 0.6% of iron which has sufficient hardness prevents the capillary end portion of the bonding jig from sinking thereinto, saving the connection wires 13 of gold or alloy thereof from breakage.

The reason why the aluminum-clad iron core strip should have its thickness finally reduced to 30 to 70% of the original value at most by cold rolling is that the flexural strength and toughness of the outer lead portions 16 of the lead frame 11 are desired to be adapted for the conditions in which a semiconductor device is applied. Where a finished semiconductor device is incorporated in the circuit of an electric appliance, the outer lead portions 16 of said semiconductor device is forced into the socket of said appliance or soldered to the electric wire thereof. In this case, the outer lead portions 16 of the lead frame 11 are sometimes subjected to the repeated application of an external bending force at the same spot and consequently is demanded to have a sufficiently great flexural strength to withstand such external bending force. The outer lead portions 16 of the lead frame 11 which are to be forced into the socket of an electric appliance should be fully tough.

The layer of aluminum alloy is preferred to have a thickness of 2 to 20 microns. The reason is that where the thickness exceeds 20 microns, then the periphery of those parts of the inner lead portions 15 to which the connection wires 13 of gold or alloy thereof are bonded by thermal pressure bonding is raised, resulting in the possible breakage of said connection wires 13. Conversely, where the layer of aluminum alloy has a smaller thickness than 2 microns, then said layer presents an insufficient elastic deformation. If the same amount of pressure is applied regardless of the thickness of said layer, then the bonded strength of the connection wires of gold or alloy thereof and inner lead portions 15 would decrease in the case of a thin layer of aluminum alloy. An attempt to elevate said bonded strength in the above-mentioned case would make it necessary to apply a greater force in order to attain a satisfactory bonded strength. Since application of a high pressure for thermal pressure bonding is not desirable, the layer of aluminum alloy is preferred to have a thickness of 2 to 20 microns for practical purpose.

Practical tests of a semiconductor device formed of a lead frame according to this invention show that an iron core strip clad with a layer of aluminum alloy is preferred to have properties whose values fall in the undermentioned range.

| Item of test | Range |
| --- | --- |
| Tensile strength | 50 to 70 (kg/mm²) |
| Angular degree of recoiling of a raw iron core strip clad with a layer of aluminum alloy | 20° to 29° |
| Brinell hardness of the raw iron core strip | 170 to 200 ($H_y$) |
| Number of bendings | 5 or more bendings in the rolling direction of the iron core strip clad with a layer of aluminum alloy and 2 or more bendings in a direction perpendicular to the rolling direction required for said iron core strip to be broken |

Figure 5:
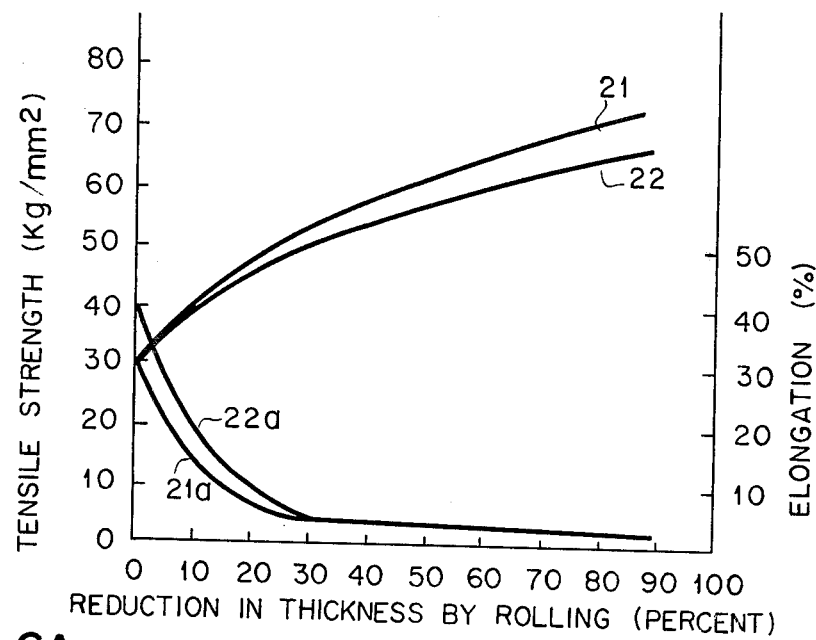
FIG. 5 shows the relationship between the reduced thickness by rolling and tensile strength of a clad material constituting the lead frame of FIG. 1 and also the relationship between the reduced thickness and elongation of said clad material caused by rolling.

Referring to FIGS. 5 to 8, the abscissa shows the progressive reductions in thickness of an iron core strip clad with a layer of aluminum alloy caused by rolling until said clad iron strip is rolled to a thickness of 0.25 mm. Referring to FIG. 5, the tensile strength and percentage elongation of said clad iron core strip are plotted on two ordinates. The curves 22, 21 denote the tensile strengths (km/mm²) of said clad iron core strip in the rolling direction thereof and a direction perpendicular thereto. The curves 22a, 21a represent the percentage elongations of said clad iron core strip in the rolling direction thereof and a direction perpendicular thereto.

Figure 6A:
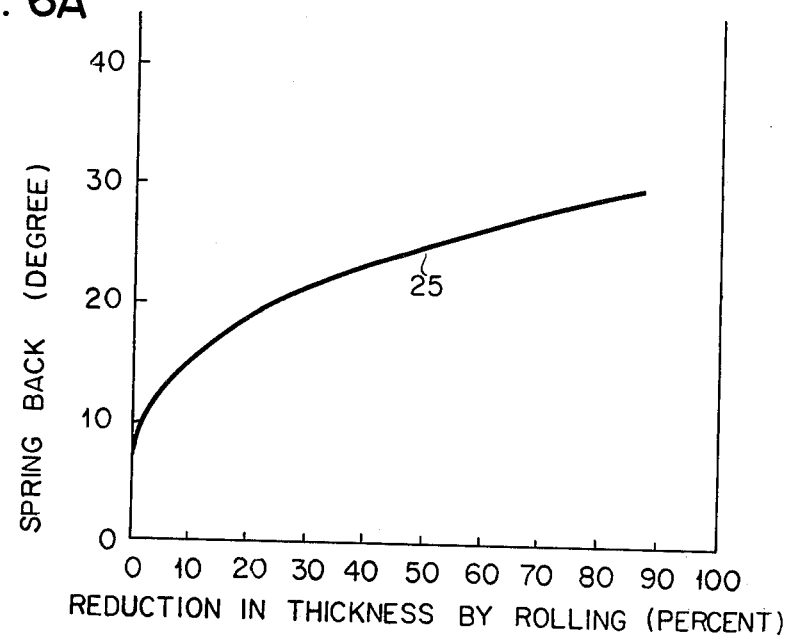
FIG. 6A shows the relationship between the reduced thickness by rolling and recoiling of the clad material constituting the lead frame of FIG. 1.
Figure 6B:
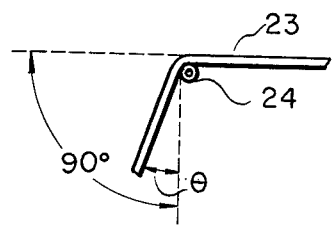
FIG. 6B illustrates the process of measuring the degree of recoiling presented by the clad material.

FIG. 6B illustrates the process of measuring the angular degree θ of recoiling of a band-shaped sample 23 cut out of an iron core strip with aluminum alloy by bending said sample through 90° at one end about a 3 mm-radius roller 24 and thereafter releasing said bent portion. The curve 25 shows the angular degree of recoiling of the clad iron core strip plotted on the ordinate after measured by the process of FIG. 6B. The curve 26 of FIG. 7 indicates the Vickers' hardness $H_v$ of the exposed surface of the iron core strip measured after removing the layer of aluminum alloy clad thereon. The curves 28, 27 of FIG. 8A denote the flexural strength of the band-shaped sample of the clad iron core strip or the number of times said sample was subjected to repeated bendings in the rolling direction of said strip and a direction perpendicular thereto respectively. The curves 28, 27 indicate the number of times the band-shaped sample inserted into a slit formed in a measurement base block 29 was subjected to repeated bendings under a pulling load of 500 grams until it was broken, with two 90° bendings in the opposite directions taken as one cycle, and also with the radius of said bending set at zero. As apparent from the curves 28, 29 of FIG. 8A, the sample of the iron core strip clad with a layer of aluminum alloy presented widely different numbers of bendings between the rolling direction and a direction perpendicular thereto until said sample was broken. Therefore, it is preferred that the direction in which the outer lead portions 16 extend lengthwise of the iron core strip be aligned with the rolling direction thereof. Further, it is desired from the collective consideration of FIGS. 5 to 8 that an iron core strip clad with a layer of aluminum alloy be finally rolled to 30 to 70% of its original thickness at most.

What we claim is:

1. A lead frame for a semiconductor device comprising:
   a. a semiconductor chip-mounting portion;
   b. inner lead portions which are to be connected to the electrode of the semiconductor chip;
   c. outer lead portions connected to the inner lead portions; and
   d. connection portions which couple said chip mounting portion, outer and inner lead portions together; wherein said chip-mounting portion, inner lead portions and outer lead portions are each formed of an iron core sheet, both sides of which are clad with layers of an aluminum alloy containing 0.5% to 1.5% by weight of silicon and 0.3 to 0.6% by weight of iron, wherein said layers are from 2 - 20 microns thick.

2. The lead frame of claim 1 wherein said aluminum alloy consists essentially of 0.5 to 1.5% by weight of silicon, 0.3 to 0.6% by weight of iron and the remainder is essentially aluminum.

3. A process for making a lead frame for a semiconductor device including steps of cold pressing an iron core sheet and layers of aluminum alloy put on both sides of said iron core sheet in direct fact to face contact in order to form an integral firmly clad material, said aluminum alloy layer containing 0.5 to 1.5% by weight of silicon and 0.3 to 0.6% by weight of iron; annealing said clad material at temperatures ranging between higher than the softening point of said iron core sheet and lower than 600° C; cold rolling the iron core sheet to 30 to 70% of its original thickness at most, with the thickness of said aluminum alloy layer reduced to 2 to 20 microns; and punching said clad material to form a lead frame for a semiconductor device having a semiconductor chip-mounting portion, inner lead portions to be connected to electrodes of said semiconductor chip and outer lead portions connected to said inner lead portions, all these portions being coupled together by conductive portions.

* * * * *